(12) United States Patent
Syme et al.

(10) Patent No.: US 10,481,278 B2
(45) Date of Patent: Nov. 19, 2019

(54) TISSUE-EQUIVALENT DOSIMETER

(71) Applicant: DALHOUSIE UNIVERSITY, Halifax (CA)

(72) Inventors: Alasdair Syme, Halifax (CA); Ian Hill, Halifax (CA)

(73) Assignee: DALHOUSIE UNIVERSITY, Halifax, NS (CA)

( * ) Notice: Subject to any disclaimer, the term of this patent is extended or adjusted under 35 U.S.C. 154(b) by 0 days.

(21) Appl. No.: 16/092,246

(22) PCT Filed: Apr. 13, 2017

(86) PCT No.: PCT/CA2017/050465
§ 371 (c)(1),
(2) Date: Oct. 9, 2018

(87) PCT Pub. No.: WO2017/177338
PCT Pub. Date: Oct. 19, 2017

(65) Prior Publication Data
US 2019/0162863 A1    May 30, 2019

Related U.S. Application Data

(60) Provisional application No. 62/365,179, filed on Jul. 21, 2016, provisional application No. 62/321,879, filed on Apr. 13, 2016.

(51) Int. Cl.
*G01T 1/02* (2006.01)
*H01L 51/05* (2006.01)
*H01L 51/44* (2006.01)

(52) U.S. Cl.
CPC .............. *G01T 1/026* (2013.01); *G01T 1/02* (2013.01); *H01L 51/0512* (2013.01); *H01L 51/44* (2013.01)

(58) Field of Classification Search
CPC ...................................................... G01T 3/08; G01T 3/065; G01T 3/008; G01T 3/006; G01T 3/001; G01T 1/105; G01T 1/115; G01T 1/161; G01T 1/02
See application file for complete search history.

(56) References Cited

U.S. PATENT DOCUMENTS

| 4,880,986 A | 11/1989 | Yamada et al. |
| 6,278,117 B1 | 8/2001 | Bardash |
| (Continued) | | |

FOREIGN PATENT DOCUMENTS

| DE | 3910051 | 10/1990 |
| JP | 0519062 | 1/1993 |
| (Continued) | | |

OTHER PUBLICATIONS

International Search Report for PCT/CA2017/050465 dated Aug. 23, 2017.

*Primary Examiner* — David P Porta
*Assistant Examiner* — Mamadou Faye
(74) *Attorney, Agent, or Firm* — Hill & Schumacher

(57) ABSTRACT

Radiation dosimeters are disclosed whereby a passive multilayer substrate is provided to confer tissue equivalence. In an example embodiment, a multilayer substrate is formed over a semiconductor-based radiation sensing layer, where the multilayer substrate includes at least one low-atomic-number layer of having an effective atomic number that is smaller than that of water, and at least one high-atomic-number layer having an effective atomic number that is greater than that of water. The low-atomic-number layers and high-atomic-number layers are provided with respective thicknesses and compositions for modulating the dependence of the signal produced by the radiation dosimeter on photon energy, such that the signal, when calibrated to provide a measure of dose, exhibits approximate tissue-equivalence over a prescribed photon energy range. The
(Continued)

multilayer substrate may be configured such that tissue equivalence is provided over an energy range including diagnostic and therapeutic energy ranges, spanning, for example, 20 keV to 5 MeV.

21 Claims, 9 Drawing Sheets

(56) References Cited

U.S. PATENT DOCUMENTS

| | | |
|---|---|---|
| 7,186,987 B1 | 3/2007 | Doty et al. |
| 7,227,152 B2 | 6/2007 | Brabec et al. |
| 8,130,905 B1 | 3/2012 | Nelms |
| 8,421,022 B2 | 4/2013 | Rozenfeld |
| 8,742,357 B2 | 6/2014 | Rozenfeld |
| 8,829,453 B2 | 9/2014 | Bengtsson et al. |
| 2005/0038620 A1 | 2/2005 | Ritt |
| 2006/0027756 A1 | 2/2006 | Thomson et al. |
| 2007/0020793 A1 | 1/2007 | Adamovics |
| 2010/0090118 A1 | 4/2010 | Rozenfeld |
| 2010/0102242 A1 | 4/2010 | Burr et al. |
| 2011/0168920 A1 | 7/2011 | Yoder |
| 2014/0191218 A1* | 7/2014 | Katz .............. H01L 51/4273 257/40 |
| 2015/0224343 A1 | 4/2015 | Couture et al. |
| 2016/0001094 A1 | 1/2016 | Isham |

FOREIGN PATENT DOCUMENTS

| | | |
|---|---|---|
| JP | 0798382 | 8/1994 |
| JP | 2008256630 | 10/2008 |
| WO | 0011725 | 3/2000 |
| WO | 2007141503 | 12/2007 |

* cited by examiner

TISSUE-EQUIVALENT DOSIMETER

CROSS-REFERENCE TO RELATED APPLICATION

This application is a National Phase application claiming the benefit of the international PCT Patent Application No. PCT/CA2017/050465, filed on Apr. 13, 2016, in English, which claims priority to U.S. Provisional Application No. 62/365,179, titled "TISSUE-EQUIVALENT DOSIMETER" and filed on Jul. 21, 2016, and to U.S. Provisional Application No. 62/321,879, titled "TISSUE-EQUIVALENT DOSIMETER" and filed on Apr. 13, 2016, the entire contents of which are incorporated herein by reference.

BACKGROUND

The present disclosure relates to radiation detection devices, and more particularly, the present disclosure relates to radiation dosimeters.

A radiation detector is any device that generates a measurable signal in response to exposure to ionizing radiation. A radiation dosimeter is a radiation detector whose output is the amount of energy deposited per unit mass of tissue when tissue is exposed to the same field of ionizing radiation. The two terms are generally not interchangeable, because the physical processes of radiation interaction and transport can differ significantly between the medium of the detector and tissue. The translation of a measured signal from a radiation detector into a dose (energy absorbed per unit mass) typically requires knowledge of the type and energy of the radiation incident on the detector. Appropriate calibration factors can then be employed to arrive at the desired result: absorbed dose.

An ideal dosimeter would have the following characteristics: the ability to absorb radiation in a manner that closely mimics absorption by the human body, independent of the type of radiation, its energy, direction or dose rate, and the ability to provide accurate, reproducible readings in real time. Currently, no radiation dosimeter in routine clinical use can accomplish these goals simultaneously. Widely used dosimeters such as ionization chambers, diodes, thermoluminescent dosimeters (TLDs), metal oxide semiconductor field-effect transistors (MOSFETs) or radiochromic film all fail in at least one of these requirements.

For example, ionization chambers have relatively small energy dependence at photon energies in the range of 1-10 MeV, however, in the diagnostic imaging energy range of photon energies in the range of 20-140 keV, the dependence of the signal on photon energy becomes much more substantial.

In FIGS. 1A and 1B, the attenuation coefficient of photons as a function of energy is shown for various materials. At energies below approximately 150 keV, the attenuation coefficient of silicon diverges substantially from that of tissue (by up to a factor of nearly 7). In this energy range the attenuation coefficient begins to depend very strongly on the elemental composition of the material in through which the photons pass.

Diodes are composed primarily of silicon, which introduces a substantial photon energy dependence at lower photon energies due to the significantly enhanced photoelectric cross section relative to that of tissue, as can be seen from FIGS. 1A and 1B. The same is true of MOSFETs. Tissue-equivalent dosimeters such as radiochromic film and lithium fluoride thermoluminescent dosimeters (TLDs) are not capable of generating real-time signals (radiochromic film requires a development period of at least 12 hours and TLDs are stored for at least 4 hours prior to readout). They also require access to additional infrastructure (e.g. a scanner for film and a specialized reader for TLDs) that is not portable and prohibits readout at the time and location of exposure.

SUMMARY

Radiation dosimeters are disclosed whereby a passive multilayer substrate is provided to confer tissue equivalence, or approximate tissue equivalence. In an example embodiment, a multilayer substrate is formed over a semiconductor-based radiation sensing layer, where the multilayer substrate includes at least one low-atomic-number layer of having an effective atomic number that is smaller than that of water, and at least one high-atomic-number layer having an effective atomic number that is greater than that of water. The low-atomic-number layers and high-atomic-number layers are provided with respective thicknesses and compositions for modulating the dependence of the signal produced by the radiation dosimeter on photon energy, such that the signal, when calibrated to provide a measure of dose, exhibits approximate tissue-equivalence over a prescribed photon energy range. The multilayer substrate may be configured such that tissue equivalence is provided over an energy range including diagnostic and therapeutic energy ranges, spanning, for example, 20 keV to 5 MeV.

Accordingly, in one aspect, there is provided a radiation dosimeter comprising:
a multilayer substrate;
a semiconductor-based radiation sensing layer contacting said multilayer substrate; and
said radiation sensing layer comprising electrodes for receiving a signal produced in response to radiation absorbed within said radiation sensing layer; and
said multilayer substrate comprising:
at least one low-atomic-number layer of having an effective atomic number that is smaller than that of water; and
at least one high-atomic-number layer having an effective atomic number that is greater than that of water;
wherein said low-atomic-number layers and said high-atomic-number layers have respective thicknesses and compositions for modulating a dependence of the signal produced by said radiation dosimeter on photon energy, such that the signal, when calibrated to provide a measure of dose, exhibits tissue-equivalence with a variation of less than 10% over an energy range spanning 20 keV to 140 keV.

In another aspect, there is provided a radiation dosimeter comprising:
a multilayer substrate;
a radiation sensing layer contacting said multilayer substrate; and
said radiation sensing layer comprising electrodes for receiving a signal produced in response to radiation absorbed within said radiation sensing layer; and
said multilayer substrate comprising:
at least one low-atomic-number layer of having an effective atomic number that is smaller than that of water; and
at least one high-atomic-number layer having an effective atomic number that is greater than that of water;
wherein said low-atomic-number layers and said high-atomic-number layers have respective thicknesses for modulating a dependence of said radiation dosimeter on photon energy, such that said radiation dosimeter is approximately water-equivalent over an energy range spanning 10 keV to 10 MeV.

In another aspect, there is provided a radiation dosimeter comprising:
a multilayer substrate; and
a radiation sensing layer contacting said multilayer substrate;
said radiation sensing layer comprising electrodes for receiving a signal produced in response to radiation absorbed within said radiation sensing layer; and
said multilayer substrate comprising:
at least one low-atomic-number layer of having an effective atomic number that is smaller than that of water; and
at least one high-atomic-number layer having an effective atomic number that is greater than that of water.

A further understanding of the functional and advantageous aspects of the disclosure can be realized by reference to the following detailed description and drawings.

BRIEF DESCRIPTION OF THE DRAWINGS

Embodiments will now be described, by way of example only, with reference to the drawings, in which.

DETAILED DESCRIPTION

Figure 1A:
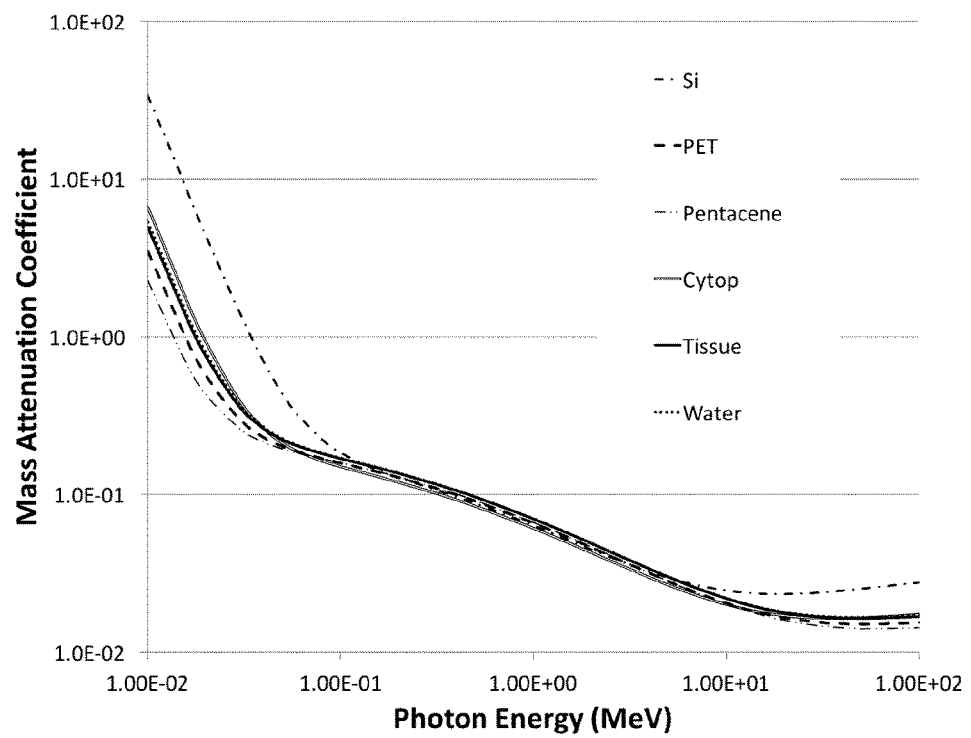
FIG. 1A plots the mass attenuation coefficient of photons as a function of energy for a number of different materials.

Various embodiments and aspects of the disclosure will be described with reference to details discussed below. The following description and drawings are illustrative of the disclosure and are not to be construed as limiting the disclosure. Numerous specific details are described to provide a thorough understanding of various embodiments of the present disclosure. However, in certain instances, well-known or conventional details are not described in order to provide a concise discussion of embodiments of the present disclosure.

As used herein, the terms "comprises" and "comprising" are to be construed as being inclusive and open ended, and not exclusive. Specifically, when used in the specification and claims, the terms "comprises" and "comprising" and variations thereof mean the specified features, steps or components are included. These terms are not to be interpreted to exclude the presence of other features, steps or components.

As used herein, the term "exemplary" means "serving as an example, instance, or illustration," and should not be construed as preferred or advantageous over other configurations disclosed herein.

As used herein, the terms "about" and "approximately" are meant to cover variations that may exist in the upper and lower limits of the ranges of values, such as variations in properties, parameters, and dimensions. Unless otherwise specified, the terms "about" and "approximately" mean within 10 percent or less of a given value.

It is to be understood that unless otherwise specified, any specified range or group is as a shorthand way of referring to each and every member of a range or group individually, as well as each and every possible sub-range or sub-group encompassed therein and similarly with respect to any sub-ranges or sub-groups therein. Unless otherwise specified, the present disclosure relates to and explicitly incorporates each and every specific member and combination of sub-ranges or sub-groups.

As used herein, the term "on the order of", when used in conjunction with a quantity or parameter, refers to a range spanning approximately one tenth to ten times the stated quantity or parameter.

Various aspects of the present disclosure address the aforementioned problems associated with known radiation dosimeters by providing a semiconductor-based radiation dosimeter that includes a plurality of layers that are selected to modulate the dependence of the dosimeter signal on photon energy such that the photon energy dependence mimics or approximates that of water. By providing such a passive photon-energy-dependence modulating multilayer substrate, through which incident radiation passes before encountering the radiation sensing layer of the radiation dosimeter, the goals of tissue-equivalence and real-time response can potentially be achieved.

As used herein, the phrase "tissue equivalence" refers to a radiation dosimeter configured such that its calibrated signal, providing a measure of dose, has a dependence on photon energy that is equivalent to that of water, within a prescribed variability range, over a defined photon energy range. For example, a tissue-equivalent radiation dosimeter may be configured such that its calibrated signal, providing a measure of dose, has a dependence on photon energy that is equivalent to that of water, within a variation of 10%, over a range from 10 keV to 20 MeV. Such a tissue-equivalent radiation dosimeter would produce a calibrated dose measure, at any photon energy within 10 keV to 20 MeV, differing from that of water, by less than 10%. The aforementioned configuration is but one example of a tissue-equivalent dosimeter, and many other examples are described in detail below.

One of the benefits of a tissue-equivalent dosimeter is a simpler calibration process, since a single calibration procedure would be appropriate for all energies within the specified tissue-equivalent range. The lack of universal calibration prevents other dosimeters (such as ion chambers, diodes and MOSFETs) from being routinely used for in vivo dosimetry purposes in low energy applications such as diagnostic imaging.

Figure 1B:
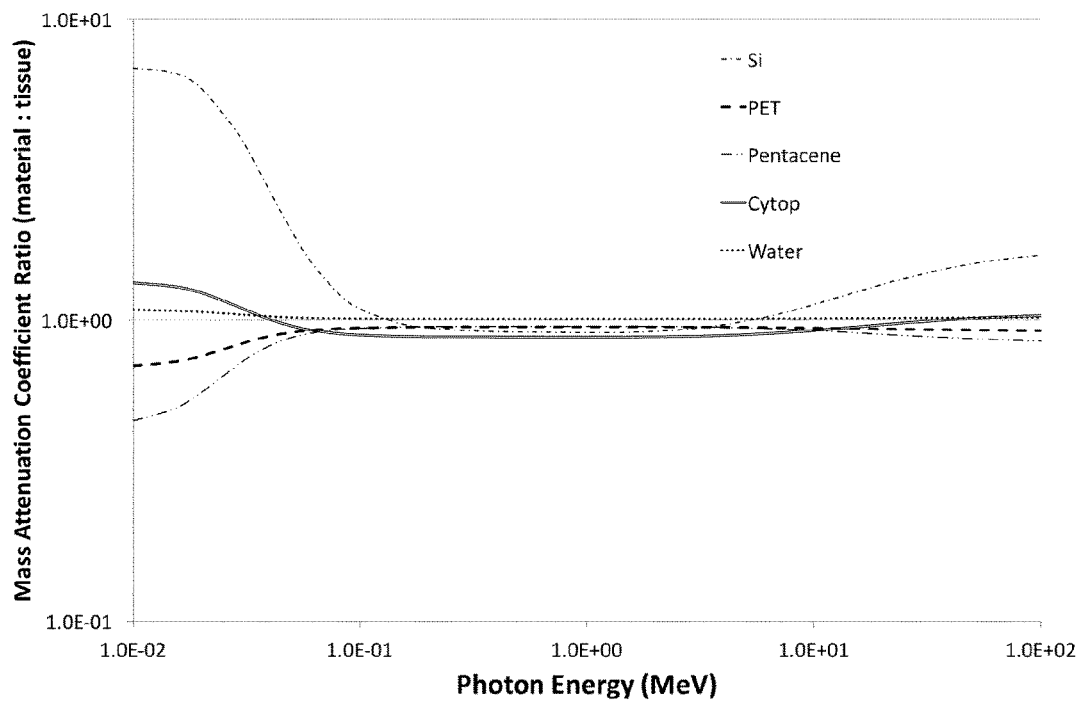
FIG. 1B plots the ratio of the mass attenuation coefficient for different materials relative to that of tissue a function of photon energy.

Referring now to FIG. 1B, the attenuation coefficient of photons as a function of energy is shown, relative to water, for various materials. The attenuation coefficient of silicon diverges substantially from that of tissue/water (by up to a factor of nearly 7). In this photon energy range, the attenuation coefficient begins to depend very strongly on the elemental composition of the material through which the photons pass. Other materials characterized in the figure include the hydrocarbon-based materials pentacene and PET (Polyethylene terephthalate). CYTOP® is a fluoropolymer having attenuation coefficients that, at low energies, are greater than that of tissue, while the hydrocarbons have mass attenuation coefficients lower than that of tissue.

Therefore, as can be seen from FIG. 1B, some materials, such as Si and CYTOP®, have a mass attenuation coefficient that exhibits a dependence of photon energy that increases, relative to water, at low energies below approximately 150 keV, while other materials, such as PET and pentacene, exhibit a dependence on photon energy that decreases, relative to water, at low energies below approximately 150 keV. Similar trends are observed on the high-energy side beyond 10 MeV.

In various embodiments of the present disclosure, a radiation dosimeter includes a plurality of passive layers having different trends in the photon energy dependence of their respective mass attenuation coefficients, relative to that of water, where these passive layers modulate the photon energy dependence of the underlying radiation sensing layer. As described in detail below, by selecting appropriate compositions and thicknesses for two or more layers of a passive multilayer substrate, the photon energy dependence of the radiation dosimeter can be modulated to achieve or approximate tissue equivalence.

In various example embodiments that are described below, radiation dosimeters are described that employ semiconductor devices in their radiation sensing layer. In some example embodiments, the semiconductor devices are organic devices, such as organic field-effect transistors (OFETs). It will be understood that OFETs are but one example of a wide variety of semiconductor devices (both organic and inorganic) that may be employed in the radiation sensing layer of a radiation dosimeter according to the present disclosure. Non-limiting examples of other types of semiconductor-based radiation sensing devices include diodes, light emitting diodes, as well as more complicated electrical circuits (such as memory or logic circuits that can be derived from more basic devices).

Field-effect transistors are transistors that use an electric field to control the shape and hence the electrical conductivity of a channel of one type of charge carrier in a semiconductor material. An organic field-effect transistor (OFET) is one particular type of field-effect transistor in which, at minimum, the semiconductor material is organic in nature (i.e. primarily hydrocarbon based). As described below, organic electronic devices have the potential to serve as tissue-equivalent dosimeters in many commonly encountered radiation fields. They also have the benefits of real time readout and established techniques (from their silicon analogues) to minimize the dependence of the readout on environmental factors such as temperature. Thus, organic electronics have the potential to realize many of the requirements of the ideal radiation dosimeter.

Figure 2A:
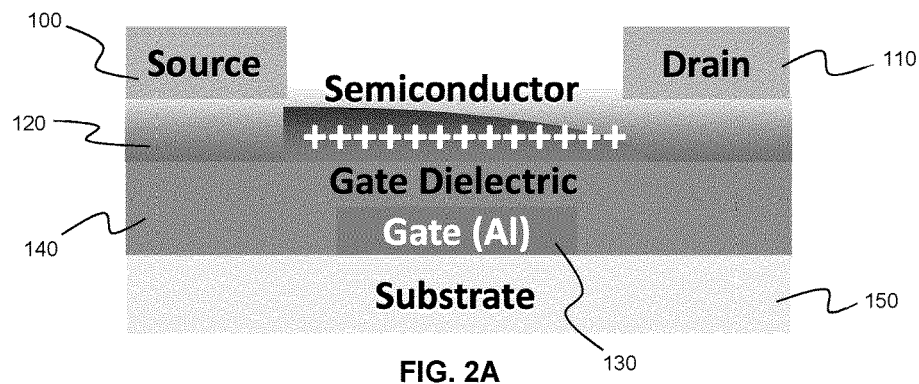
FIGS. 2A and 2B schematically illustrate two typical organic field-effect transistor (OFET) configurations: a bottom gate layout and top gate configuration, respectively. Both configurations achieve the same objective of using an electric field to regulate current flow between the source and drain electrodes.
Figure 2B:
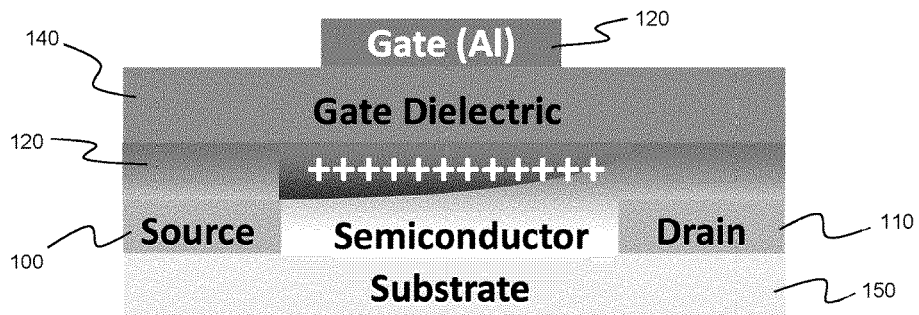

In FIGS. 2A and 2B, two example configurations of conventional OFET-based radiation detectors are shown. They are referred to as bottom gate (FIG. 2A) and top gate (FIG. 2B) devices. Each device includes a source 100 and drain 110, which are configured to conduct an electrical current through the semiconductor channel 120. The semiconductor channel 120 is adjacent to a gate 130, and is separated from the gate 130 by a gate dielectric 140. The device is supported by a substrate 150. Ionizing radiation generates charges in the gate dielectric 140, resulting in trapped charges that modify the threshold voltage of the FET. In the bottom gate configuration, the gate electrode 130 is deposited on to the substrate, while in the top gate configuration, the gate electrode 130 is deposited on top of the gate dielectric layer 140 of the device.

Depending on the device configuration, different electrical signal parameters may be employed to obtain a measurement associated with dose. In some example implementations, the measured signal may be a voltage, such as a threshold voltage of a FET device, while in other example implementations, the current could be measured (or integrated) to determine dose (using a device such as an electrometer), and that changes in current could be used to calibrate the device.

The signal from the OFET device will consist of, most likely, a voltage or a current (or a rate of change of one of these quantities). Generally, the fundamental quantity that changes in a radiation-sensing FET device after exposure to radiation is the threshold voltage. This shift in threshold voltage is mediated by a buildup of trapped charge in the dielectric layer, an increased number of traps at the interface between the dielectric and the organic semiconductor as well as an increase in the number of charge traps in the bulk of the dielectric. Since reading the threshold voltage directly can be a complex task, a surrogate measure is often used. For example, in one implementation, a threshold voltage may be defined as the gate voltage that must be applied to maintain a source-drain current of 100 micro Amps.

To calibrate an OFET device, the threshold voltage is measured before exposure and it is measured again after the device has been exposed to a known dose of radiation. This change in threshold voltage then defines a sensitivity expressed in V/Gy (change in threshold voltage per unit absorbed dose). In subsequent exposures, the change in threshold voltage can then be divided by this sensitivity (calibration factor) to give the desired result: dose. If the device has a tissue-equivalent, or approximately tissue-equivalent dependence on photon energy, this operation can be performed in an arbitrary radiation field (within the tissue-equivalent photon range) provided that the output of the field is known. The calibration factor will then be valid in other radiation fields at other photon energies within the tissue-equivalent photon range. Following calibration of the device, a value of dose reported by the system will be the dose that would be received by a small mass of tissue, if said small mass of tissue were exposed to the same radiation field—independent of the energy of the radiation field.

Although the preceding example embodiment referred to the use of a threshold voltage for device calibration, it will be understood that other electrical measures or parameters may be employed. For example, non-limiting electrical calibration measures include: the voltage required to drive a pre-determined current between the source and drain electrodes; and the current driven by a fixed voltage, may be employed for calibration.

As described below, when modelling a radiation dosimeter configured according to the embodiments of the present disclosure, Monte Carlo simulations may be employed to investigate energy deposition patterns in both water and the active volume of the detector (i.e. the dielectric layer) as a function of radiation energy. The ratio of energy absorbed by the active volume of the detector to the energy absorbed by water under the same exposure conditions is then evaluated. When this ratio remains constant, e.g. within a prescribed variation range (e.g. 5% or 10%), across a defined photon energy range, the radiation dosimeter is considered to exhibit water-equivalence over that photon energy range.

Figure 3A:
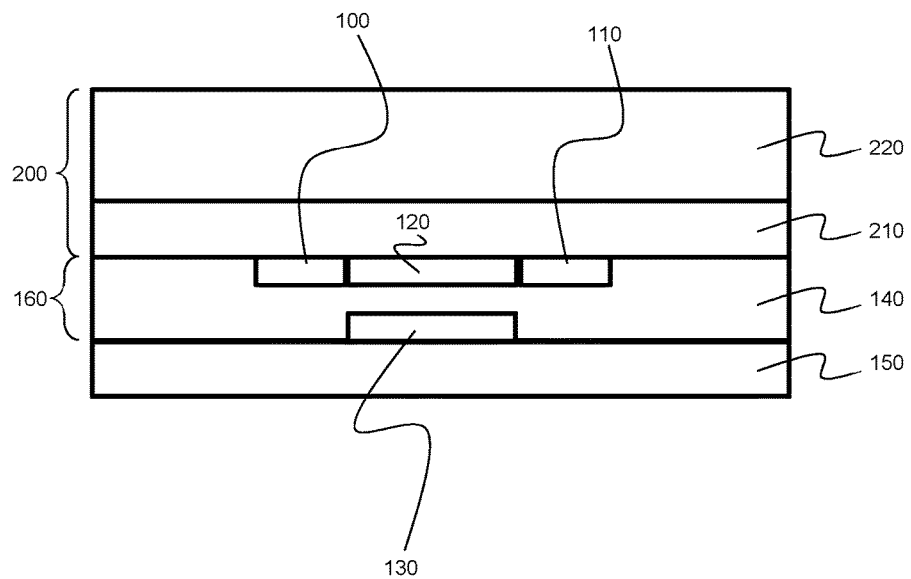
FIG. 3A shows an example embodiment of tissue-equivalent dosimeter in which a multilayer substrate is employed to modulate the photon energy dependence of the radiation sensing layer of the device.

In some example embodiments of the present disclosure, these configurations are adapted to include a multilayer substrate that confers approximate tissue equivalence to the radiation dosimeter. One example implementation is shown in FIG. 3A, in which the bottom-gate device of FIG. 2A has been modified to include two layers 210 and 220 forming an upper substrate 200, where the substrate 200 contacts the radiation sensing layer 160 such that the radiation that is to be detected passes through the substrate 200 prior to being detected within in radiation sensing layer 160. The source electrode 100, drain electrode 110 and gate electrode 130 may be electrically connected to external contact pads through conductive traces that extend laterally from the active region of the device. The contact pads may be exposed at regions by removal of one or more layers of the device, or electrically connected to through conductive vias formed in the device.

The layers 210 and 220 of the multilayer substrate 200 may be formed from organic materials, inorganic materials, or combinations thereof, provided that one layer has an effective atomic number that is smaller than that of water, and the other layer has an effective atomic number that is greater than that of water. In such a configuration, the layers 210 and 220 may be provided with respective thicknesses and compositions for modulating a dependence of the signal produced by the radiation dosimeter on photon energy, such that the signal, when calibrated to provide a measure of dose, exhibits and/or approximates tissue-equivalence. It will be understood that the ordering of the layers need not be specific and can be reversed among different embodiments.

Although many of the example embodiments disclosed herein employ polymeric materials for forming the layers of the multilayer substrate 200, it will be understood that the layers need not be polymeric. In one example embodiment, one or more layers may be polymeric, with the remainder of layers being non-polymeric. In another example embodiment, all of the layers may be non-polymeric. Non-limiting examples of non-polymeric layers include non-polymerized films of organic or inorganic materials, optionally including nanoparticles. In one example implementation, a non-polymeric layer may be formed from a hydrogel layer that is crosslinked.

In some example embodiments, the gate dielectric can have a non-polymeric composition. For example, the gate dielectric may be formed from crystalline or amorphous materials (i.e. metal oxides). The gate dielectric region could also be formed by depositing a polymer material over a thin metal oxide layer, or another non-polymeric layer. In other example embodiments, polymer nanocomposites that incorporate nanoparticles into the polymer material may be employed. Such films could also incorporate "small molecules" (including but not limited to metalloporphyrins and metal free porphyrins).

The semiconductor region 120 may be formed from an organic semiconductor, such as an organic polymer or a small-molecule-based semiconductor.

The composition and thicknesses of the layers that achieve a desired level of tissue equivalence may be determined based on simulations, where, for a given set of materials, the energy dependence of the dosimeter signal is calculated for different thicknesses, and where the thicknesses are selected that correspond to a photon energy dependence that most closely matches that of water. Examples of such methods are described in greater detail below.

Non-limiting examples of materials for the layer having an effective atomic number that is lower than water include polymeric materials such as polyethylene terephthalate, poly (methyl methacrylate), polystyrene, and other suitable plastics. Non-limiting examples of materials for the layer having an effective atomic number that is greater than water include fluoropolymers such as, but not limited to, CYTOP® (from Asahi Glass Corporation) and Teflon® (from DuPont Co.). The gate dielectric 140 may be formed, for example, from a fluoropolymer, but could also be a plastic with appropriate electrical properties (e.g. poly(methyl methacrylate). Non-limiting examples of gate dielectric materials include CYTOP® (from Asahi Glass Corporation) and Teflon (from DuPont Co.). The semiconductor region 120 may be formed from an organic semiconductor such as, but not limited to, semiconducting small molecules (aromatic hydrocarbons) including pentacene, anthracene, and rubrene. In other example implementations, the semiconducting region 120 may be formed organic semiconductors such as poly(3-hexylthiophene), and poly(p-phenylene vinylene). The source terminal 100, drain terminal 110, and gate 130 may be formed from conductive material, such as, for example, gold or aluminum, or, for example, material having improved tissue equivalence such as graphene.

The device shown in FIG. 3A may be formed, for example, by patterning the gate electrode 130 onto the substrate 150 using standard processing techniques (such as, but not limited to, vapor deposition and lithography), and subsequently depositing the gate dielectric 140 using standard techniques (such as, but not limited to, spin coating and sputtering). The semiconductor 120 may then be deposited (using a process such as, but not limited to, vapor deposition), and the source/drain electrodes may be deposited using a process such as, but not limited to, vapor deposition with a shadow mask. The layers 210 and 220 may then be deposited over the structure using standard techniques such as those described above.

Although the preceding example embodiment involved two layers for modulating the photon energy dependence of the radiation dosimeter, it will be understood that more than two layers may be employed in the multilayer substrate 200. For example, three or more layers may be included provided that at least two of the layers are configured as described above.

Figure 3B:
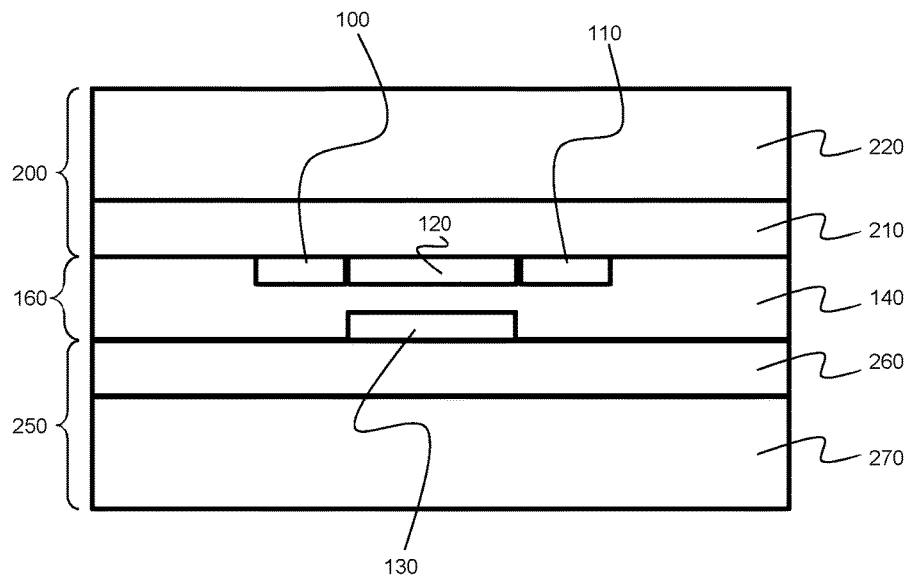
FIG. 3B shows another example embodiment of a tissue-equivalent dosimeter having multilayer substrates on both sides of the radiation sensing layer, thereby enabling bi-directional use with reduced or minimal directional dependence. The symmetry of the design reduces the directional dependence of the system and the choice of materials used as substrates and dielectric optimizes the tissue equivalence.

FIG. 3B illustrates an alternative example embodiment having a second multilayer substrate 250 formed on an opposing side of the radiation sensing layer 160. The second multilayer substrate 250 may have the same composition and layer thicknesses as the first multilayer substrate 200 (e.g. with the layers 260 and 270 arranged symmetrically with respect to the layers 210 and 220), or may be formed from different layers with different compositions and/or layer thicknesses, provided that at least two layers (e.g. layers 210 and 210) are provided with respective thicknesses and compositions for modulating a dependence of the signal produced by the radiation dosimeter on photon energy, such that the signal, when calibrated to provide a measure of dose, exhibits and/or approximates tissue-equivalence. The dimensions of the second multilayer substrate may also be determined based on simulations such as Monte Carlo simulations, in order to accommodate for variations in electrode design that may necessitate deviations from symmetry. The present example dual-substrate embodiment enables the device to be used in either direction, in a reversible configuration.

Figure 3C:
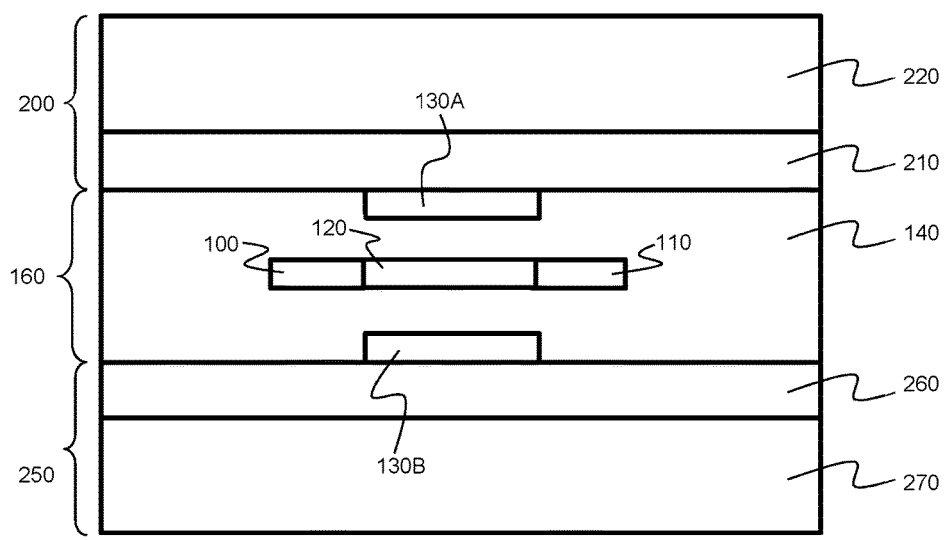
FIG. 3C shows another example embodiment of a tissue-equivalent dosimeter having a double gate symmetric configuration with multilayer substrates on both sides of the radiation sensing layer, thereby enabling bi-directional use with reduced or minimal directional dependence.

FIG. 3C illustrates another alternative example embodiment having a second multilayer substrate 250 formed on an opposing side of the radiation sensing layer 160. However, unlike the example embodiment shown in FIG. 3B, the device shown in FIG. 3C includes a double gate structure, where two gates 130A and 130B are respectively located on opposite side of the semiconductor channel 120, where each gate 130 is separated from the semiconductor channel 120 by a respective region of the gate dielectric 140. Accordingly, in one example embodiment, each gate (130A,B) is located adjacent to a respective multilayer substrate (200, 250), and the semiconductor channel 120 is located centrally between the gates, where gate dielectric is provided in the region between each gate and the semiconductor channel 120. The source 100 and drain 110 terminals may be located symmetrically within the device, as shown in FIG. 3C.

In the example embodiment shown in FIG. 3C, the device is symmetric with respect to vertically (up/down) oriented radiation fields. Both the gates (130A,B) and the multilayer substrates (200, 250) may be arranged symmetrically with respect to the semiconductor channel 120. However, in other example embodiments, one or more aspects of the device need not exhibit symmetry, either in composition or thickness, relative to the location of the semiconductor channel. For example, the layers 220/210 of the first multilayer substrate 200 may respectively differ in composition and/or thickness from the layers 260/270 of the second multilayer substrate 250.

Figure 3D:
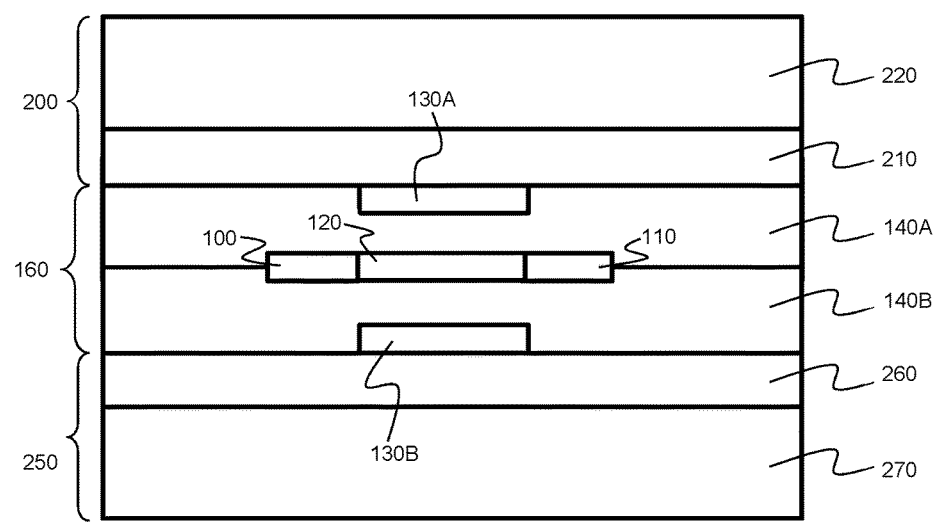
FIG. 3D shows an example embodiment of a double-gate tissue-equivalent dosimeter in which two different gate dielectric regions are employed.

As shown in FIG. 3D, the gate dielectric need not have a common composition on either side of the semiconductor channel 120. For example, as shown, two different gate dielectric regions 140A and 140B may be employed.

The addition of the second gate terminal and an additional layer of gate dielectric creates two FET (e.g. OFET) devices that can be operated from a single set of electrical contacts. The resultant device may demonstrate enhanced sensitivity relative to the single-gate embodiment shown in FIG. 3B due to the doubling of the effective volume of the detector.

In one example implementation, the two gates may be connected in a parallel. However, in other example implementations, the gates need not be connected in parallel. For example, as the gate bias affects the rate of recombination of ion/hole pairs in the dielectric, this property could be exploited for particular measurements in a radiation field using a non-parallel gate bias configuration. In one example implementation, a single gate may be connected when the device is used, as opposed to applying voltages to both gates. For example, the gate furthest (or nearest) to the tissue may be employed for detection, such that consistent and repeatable single-gate measurements are obtained irrespective of the device orientation.

As per the embodiment described in FIG. 3B, the second multilayer substrate 250 may have the same composition and layer thicknesses as the first multilayer substrate 200 (e.g. with the layers 260 and 270 arranged symmetrically with respect to the layers 210 and 220), or may be formed from different layers with different compositions and/or layer thicknesses, provided that at least two layers (e.g. layers 210 and 210) are provided with respective thicknesses and compositions for modulating a dependence of the signal produced by the radiation dosimeter on photon energy, such that the signal, when calibrated to provide a measure of dose, exhibits and/or approximates tissue-equivalence. The dimensions of the second multilayer substrate may also be determined based on simulations such as Monte Carlo simulations, in order to accommodate for variations in electrode design that may necessitate deviations from symmetry. As in the case of FIG. 3B, the present example dual-substrate embodiment enables the device to be used in either direction, in a reversible configuration. However, the increase symmetry, and optional full symmetry, as shown in FIG. 3C, may further improve the capability of the device to provide a tissue-equivalent response in either configuration.

Figure 4:
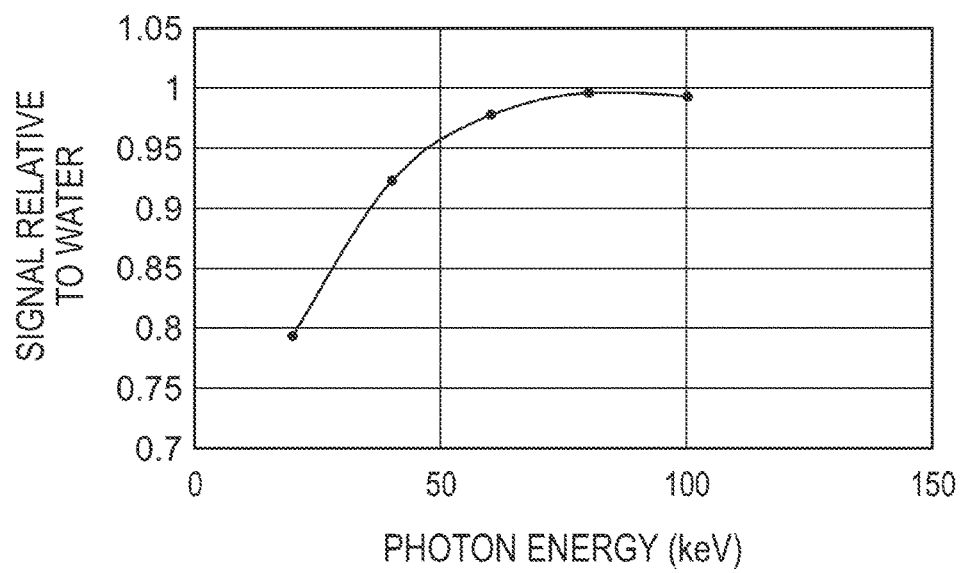
FIG. 4 plots the calculated dependence on photon energy of a bottom gate OFET device with no top coat of substrate (i.e. the embodiment shown in FIG. 3B, without the multilayer substrate). In this case, the dielectric is poly(methyl methacrylate) (PMMA), the substrate is PET and the gate electrode is aluminum. As can be seen from the figure, once the energy of the photons drop below 80 keV, the tissue-equivalence of the device is diminished.

The effect of the composition of the layers on the device performance is illustrated herebelow. In silicon-based MOSFET dosimeters, the method of signal generation is based on the dose deposited in the dielectric layer of the device. Using this as the model for the OFET response, FIG. 4 shows results from a Monte Carlo simulation of the device structure shown in FIG. 2A, absent of the multilayer substrate. The dose deposited in the dielectric (PMMA in this case) was calculated relative to the dose to water (if the detector were replaced with a small volume of water) as a function of photon energy (water is used as a surrogate for tissue, as is conventionally done in the art). As can be seen, the absence of the multilayer substrate results in a photon-energy dependence that differs substantially from the photon energy dependence of the dose delivered to water, demonstrating a photon energy dependence that departs substantially from tissue-equivalent in the photon energy range of 20-70 keV.

Figure 5:
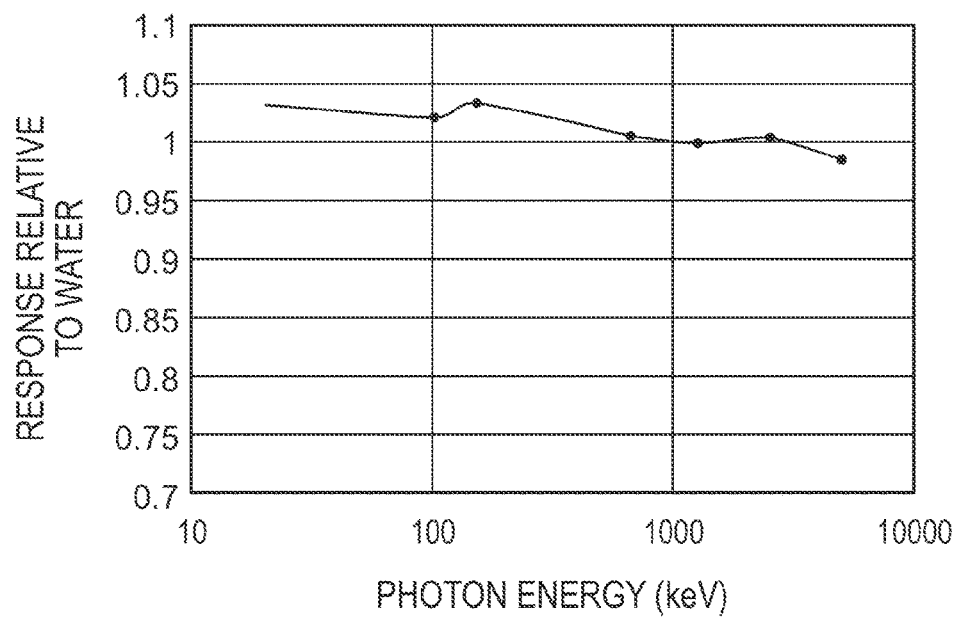
FIG. 5 plots the calculated dependence on photon energy of the embodiment illustrated in FIG. 3B. The data show the response of the device relative to water, when the data are normalized to 1250 keV. This energy was chosen as an example of a calibration of the device using a Co-60 radiation source. This figure demonstrates that under these conditions, the calibration is accurate to within ~3% from the lowest diagnostic energy up to high therapeutic energies.

Upon implementation of the design illustrated in FIG. 3B, in which the multilayer substrate modulates the photon energy dependence, the net photon energy dependence of the radiation dosimeter improves dramatically as illustrated in FIG. 5. As can be seen in this figure, response of the device exhibits a photon energy dependence that approximates that of water absorption within 5% over an energy range spanning 20 keV to 5 MeV. It is noted that the energy dependencies of the radiation dosimeter signal and the absorption of water were normalized to the value at 1250 keV. The choice of normalization at 1250 keV is because Co-60 emits radiation at this energy. This radioisotope is widely used by standards laboratories and would be an excellent candidate source for calibrating these devices. Based on these data, the devices would respond like water (within 5%) across the entire diagnostic and therapeutic energy range.

Although the example implementation illustrated in FIG. 5 shows tissue equivalence within 5% over a photon energy range of 20 keV to 5 MeV, it will be understood that the selection of other materials and thickness values may yield alternative performance parameters. In one example implementation, the layer compositions and thicknesses may be selected such that tissue-equivalence is obtained with a variation of less than 10% over an energy range spanning 10 keV to 140 keV. In another example implementation, the layer compositions and thicknesses may be selected such that tissue-equivalence is obtained with a variation of less than 10% over an energy range spanning 20 keV to 140 keV. In another example implementation, the layer compositions and thicknesses may be selected such that tissue-equivalence is obtained with a variation of less than 10% over an energy range spanning 20 keV to 10 MeV. In another example implementation, the layer compositions and thicknesses may be selected such that tissue-equivalence is obtained with a variation of less than 10% over an energy range spanning 10 keV to 20 MeV. In another example implementation, the layer compositions and thicknesses may be selected such that tissue-equivalence is obtained with a variation of less than 5% over an energy range spanning 10 keV to 140 keV. In another example implementation, the layer compositions and thicknesses may be selected such that tissue-equivalence is obtained with a variation of less than 5% over an energy range spanning 20 keV to 140 MeV. In another example implementation, the layer compositions and thicknesses may be selected such that tissue-equivalence is obtained with a variation of less than 5% over an energy range spanning 20 keV to 10 MeV. In another example implementation, the layer compositions and thicknesses may be selected such that tissue-equivalence is obtained with a variation of less than 5% over an energy range spanning 10 keV to 20 MeV.

In some example embodiments, the layer compositions and thicknesses may be selected such that tissue-equivalence is obtained within the diagnostic photon energy range of 20-140 keV, within a variation of less than 10%, or less than 5%, as measured using a polyenergetic radiation source. Such sources are characterized as generating radiation having a broad range of photon energies, with the lowest energy photons (in the 1-10 keV range) constituting only a small fraction of the overall energy. In such a case, the photon energy dependence of the radiation dosimeter may, for example, deviate from that of water within this low energy range, while still achieving water-equivalence as measured by such a polyenergetic source over a range of tube potential values of the polyenergetic source. In one example implementation, the layer compositions and thicknesses may be selected such that tissue-equivalence is obtained, with a variation of less than 10%, or less than 5%, for polyenergetic sources characterized by a tube potential within the range of ~30-150 kVp, and with corresponding half-value layers (HVLs) between 0.3-5.9 mm Al. In another example implementation, the layer compositions and thicknesses may be selected such that tissue-equivalence is obtained, with a variation of less than 10%, or less than 5%, for a mammography-type radiation source characterized by a tube potential in the range of 24-40 kVp and HLVs ranging from kVp/100<HVL<kVp/100+C, where the value of C is between 0.12 and 0.3.

As noted above, radiation dosimeters according to the embodiments provided herein may provide the ability to measure radiation doses in the diagnostic imaging energy range (e.g. 20-140 keV) and optionally the therapeutic energy range (e.g. 1-20 MeV) without requiring calibration when the photon energy of the radiation is varied. This benefit, when combined with the ability to provide time-dependent (and optionally real-time) dosimetry measurements within the diagnostic imaging energy range and optionally the therapeutic energy range may provide utility well beyond that of currently available radiation dosimeters that are known to those skilled in the art. For example, radiation dosimeters configured according to the present embodiments may find utility in both imaging and radiation oncology applications.

Moreover, the embodiments described herein may be employed to provide real-time dose monitoring in order to reduce the dose received during imaging procedures. In particular, there are presently widespread movements underway to reduce imaging dose in both pediatric patients (notably the Image Gently movement) and in adults (the Image Wisely campaign). There have also been numerous widely publicized incidents of accidental exposures in diagnostic imaging that have heightened the awareness of the public and regulators about the importance of knowing the dose administered to the patient. As such, a device that is capable of measuring dose in the diagnostic imaging setting is a timely and useful contribution to the field.

In some example embodiments, a plurality of radiation dosimeters may be defined within a common device. For example, referring two FIGS. 3A and 3B, a two-dimensional dosimeter array may be produced by fabricating a plurality of active regions (including the source 100, drain 110, semiconductor 120 and gate 130) within the radiation sensing layer 160, where the source, drain and gate electrodes of each active region are separately addressable. The small physical size (e.g. on the order of 100 μm) of each active region enables the fabrication of a high resolution array with a spatial resolution of 1 mm or less. This would represent an improvement over electronic devices that are currently in use for this purpose, which are limited to a resolution between 3-7 mm.

In some embodiments, one or more radiation dosimeters according to the embodiments disclosed herein may be employed to provide time-dependent and optionally real-time dosimetry measurements during a diagnostic or therapeutic procedure involving ionizing radiation.

Figure 6:
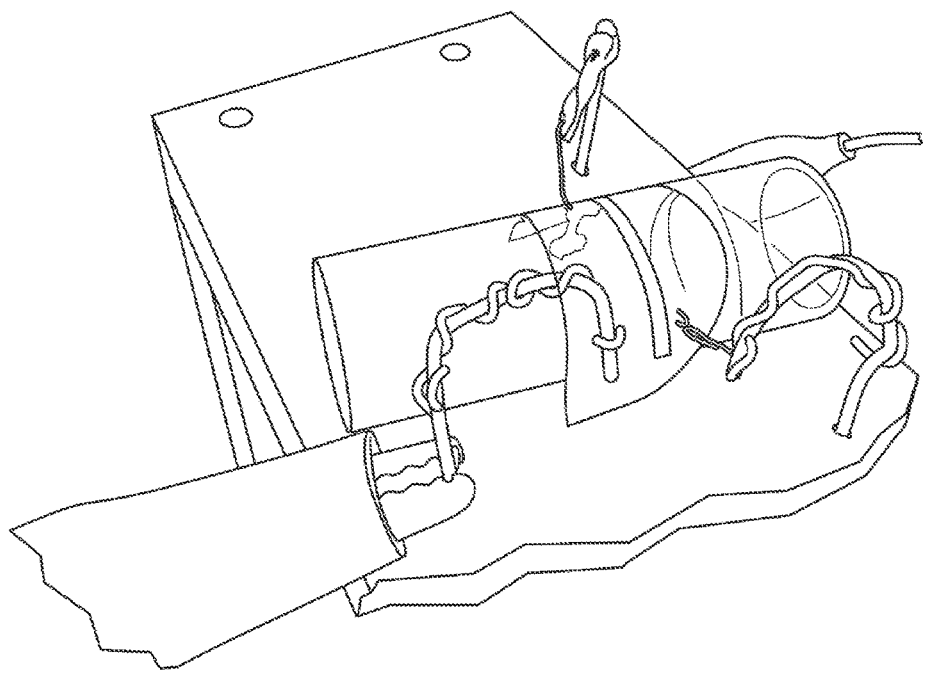
FIG. 6 shows an example of a flexible dosimeter adhered to, and conforming to, a curved surface.

In some example implementations, a flexible, radiation dosimeter may be formed as described above, and applied to a region of the patient (e.g. using an adhesive). The flexibility of such a device may be employed to achieve conformal fitting to the patient's body part that is subject to radiation, thereby enabling patient-specific dynamic and dosimetry measurements during the procedure. Such a conformal and tissue-equivalent dosimeter may be provided in the form of a two-dimensional dosimeter array, thereby providing spatially- and time-resolved dosimetry measurements during a procedure. An example of a conformal device is shown in FIG. 6, showing a flexible dosimeter adhered to, and conforming to, a curved surface.

The material composition and thicknesses of the layers may be selected to avoid undue attenuation of the radiation beam during a procedure, especially a diagnostic imaging procedure involving photon energies that are associated with higher mass attenuation coefficients. Suitable thicknesses may be determined based on the mass-attenuation coefficients of the multiple layers of the radiation dosimeter.

The radiation dosimeters according to the present embodiments may also be formed to present a small physical cross section to the radiation field which will minimize the area of the image that is affected. For high dose deliveries (i.e. those more typically encountered in radiotherapy (>1 Gy), device dimensions (active area) may be configured with an area less than 1 mm$^2$. In other example embodiments, the area could also be increased to increase sensitivity, such as an area of greater than 1 mm$^2$, but less than 1 cm$^2$. For imaging procedures, the area of the radiation dosimeter may be configured to be larger for the purpose of increasing sensitivity (e.g. greater than 1 mm$^2$).

In the radiotherapy arena, such devices may be employed, for example, in applications including: patient specific quality assurance, small field dosimetry measurements, relative dose measurements, and in-vivo dosimetry. Other potential applications for the tissue-equivalent radiation dosimeters according to the present disclosure include: (i) measurements of absorbed doses of ionizing radiation in a therapeutic radiation oncology environment; (ii) measurement of absorbed doses of ionizing radiation in a diagnostic imaging environment (without the need for recalibration for each imaging energy); (iii) In vivo dosimetry for patient dose monitoring in a radiation therapy environment; (iv) small field dose measurements that are particularly challenging with other forms of radiation detectors; and (v) planar dose distribution measurements based on a two dimensional array of radiation dosimeter devices.

Figure 7:
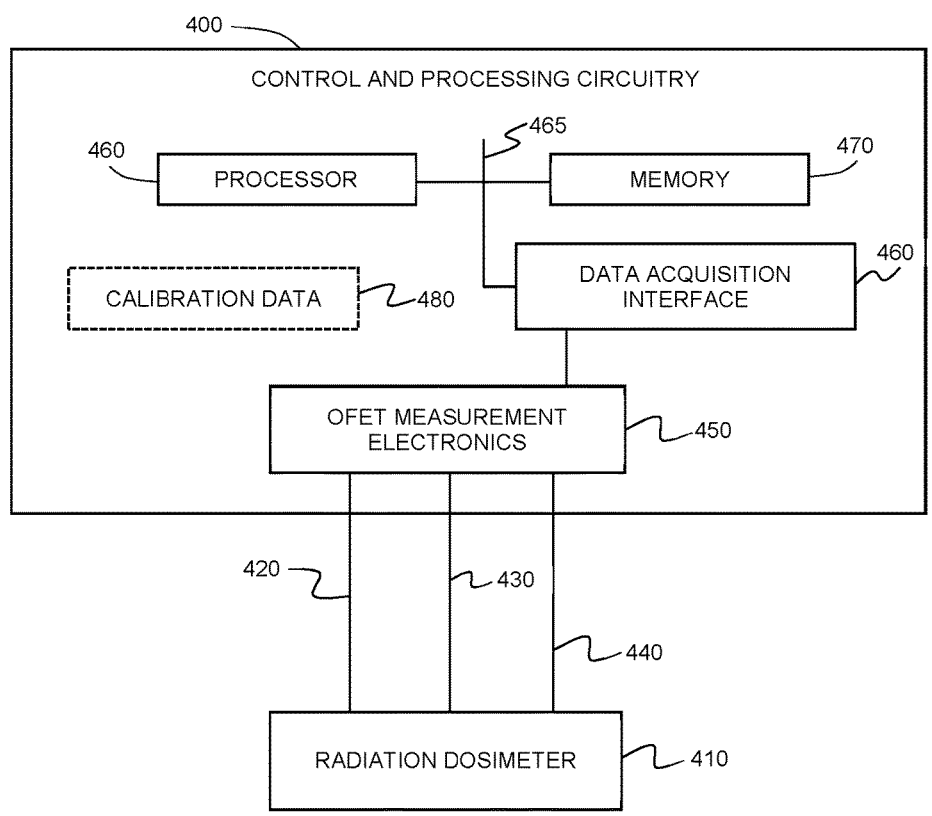
FIG. 7 shows an example of a system for performing radiation dosimetry.

Referring now to FIG. 7, an example radiation dosimetry system is shown, including a control and processing circuitry 400 interfaced with a tissue-equivalent radiation dosimeter 410. In the present example, the tissue-equivalent radiation dosimeter is a FET-based device, and the source, drain and gate terminals are connected, respectively, through conductive paths 420, 430 and 440 to FET measurement electronics 450. The FET measurement electronics provide electrical driving signals to the FET and measure suitable voltages, currents or changes in voltages or currents to determine a quantity of interest, such as the threshold voltage of the device. The FET measurement electronics may be any suitable electronics known in the art for measuring a signal associated with radiation dose, and may include electronic components such as amplifiers and comparators. The example control and processing circuitry 400 also includes a data acquisition interface 460 for acquiring the measured signals from the FET measurement electronics 450, and one or more processors 460 and memory 470, interfaced through a bus 465. The processor 470 executes instructions stored in the memory 470 to employ stored calibration data (shown at 480) to calibrate the acquired dosimeter signal and thereby generate a calculated dose.

While many tissue equivalent dosimeters require hours of delay before signal readout (e.g. radiochromic film, thermoluminescent dosimeters (TLDs) and optically stimulated luminescent dosimeters (OSLDs)), the semiconductor-based tissue-equivalent dosimeters described in the present disclosure (such as the example OFET-based devices) can be read out immediately after an exposure to radiation, and are therefore capable of real-time readout. In addition, since the present devices can be powered during exposure to radiation, their electrical signals can be processed during a procedure involving radiation exposure, thereby optionally providing real-time readout during exposure.

Accordingly, a system such as the example system shown in FIG. 7 may be employed to provide dynamic, time-dependent (and optionally spatially-resolved) dose measurements obtained during a diagnostic or therapeutic procedure involving ionizing radiation. In some example embodiments, the processor 460 may be employed to compare one or more real-time dose measures, such as a measure of accumulated dose, to pre-selected dose criteria. For example, if a threshold associated with real-time dose is crossed, the processor 460 may be employed to generate an alarm, or the processor 460 may send a control signal to the radiation source system (not shown) in order to halt or modify the operation of the radiation source.

EXAMPLES

The following examples are presented to enable those skilled in the art to understand and to practice embodiments of the present disclosure. They should not be considered as a limitation on the scope of the disclosure, but merely as being illustrative and representative thereof.

Example 1: Performance with a Single Layer

As part of the optimization of the design of the organic electronic device shown in FIG. 3B, other configurations were explored using Monte Carlo simulations. Monte Carlo simulations are computer-based simulations that track particles of ionizing radiation as they pass through different media. This is a standard technique in Medical Physics for carrying out this type of investigation.

Monte Carlo simulations were performed using the EGSnrc code to evaluate the energy dependence of each OFET configuration. In one set of simulations, the detailed compositions and geometries of the devices was used. In a second set, the devices were modelled as a volume of water (with the same dimensions as the fully characterized devices). Energy deposition in both sets of simulations was scored in the sub volume of the device identified as the dielectric layer.

Figure 8:
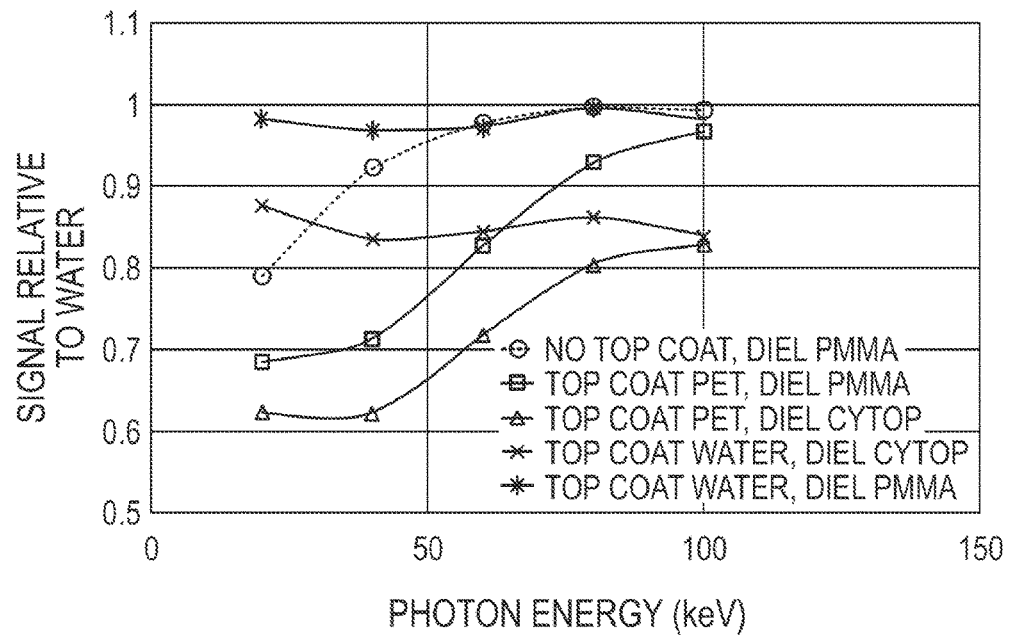
FIG. 8 plots the dependence on photon energy of an example embodiment having a substrate with a single layer (e.g. in the case of a symmetric design, one layer on either side of the radiation sensing layer), illustrating the inability of a single layer to confer a water-equivalent dependence on photon energy.

In FIG. 8, the energy dependence of the detector system was investigated when there was only a single top coat material (i.e. there was only one layer in the substrate). When the top coat is "water" (in the simulations), the energy dependence is small, regardless of the dielectric material. This is evidenced by the relatively flat lines (solid black and small dash) in FIG. 8. It would, however, be impossible to have a true "water" top coat for the devices, so a practical solution is to use a material that is as water-like as possible. The choice of PET (polyethylene terephthalate) in the present example is based on its hydrocarbon composition and the fact that it can be highly flexible. Like all predominantly hydrocarbon materials, the interaction cross section for photons in this material deviates significantly from that of water at low (10-100 keV) energies. Regardless of the dielectric material (PMMA or CYTOP®) the introduction of a top coat of PET creates a substantial energy dependence as the photon energy decreases (as shown with the circle, square and triangle markers). This behavior would be observed with any organic material being used as a top coat, but the magnitude of the effect would be dependent on the actual chemical composition of the material. This failure of a single layer to confer tissue-equivalent photon energy dependence highlights the need for at least one additional layer.

Example 2: Determination of Thickness of Second Layer

Figure 9:
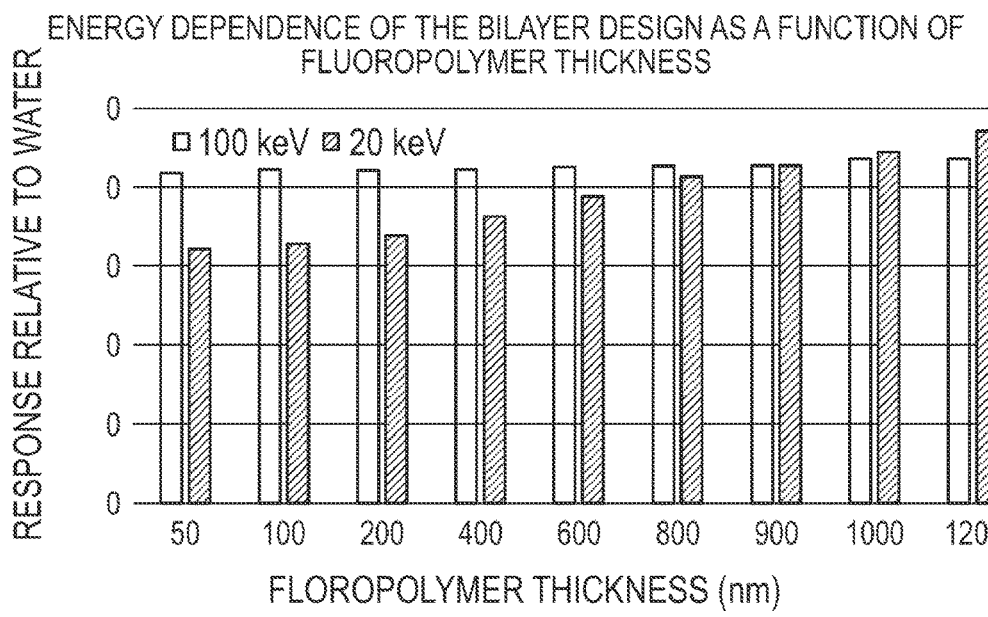
FIG. 9 shows results from simulations based on the example device configuration shown in FIG. 3B, simulated at different photon energies (20 keV and 100 keV), and showing the dependence on response at these different photon energies on the thickness of one of the layers of the substrate.

The use of the second layer in FIGS. 3A and 3B is intended to balance out the decreased interaction cross sections of hydrocarbons with increased interactions of fluorocarbons. In FIG. 9, the results of a numerical optimization experiment are shown. In this case, the thickness of the layer having an effective atomic number greater than that of water is varied. In the present example, CYTOP® was used as this layer. It is noted that in general, there is no requirement that this layer be CYTOP®—rather, it must be a material whose chemical properties make it amenable to appropriate forms of deposition on the other materials of the device and whose photon interaction cross section's energy dependence is complementary to that of the material of the other layer, such that the combination of materials results in an energy dependence that is similar to that of water or tissue across the diagnostic and therapeutic photon/electron energy range (i.e. 10 keV-20 MeV).

The results shown in FIG. 9 are based on the structure shown in FIG. 3B, with the following layer compositions: layers 210 and 260: PET (0.1 mm), layers 220 and 270: CYTOP® (variable thickness), gate terminal 130: aluminum (50 nm), gate dielectric 140: CYTOP® (200 nm), and semiconductor 120: pentacene (50 nm), source and drain electrodes: gold (50 nm). As can be seen in the figure, a thickness of 900 nm for layers 220 and 270 yields the optimum tissue equivalence across the diagnostic energy range. For any combination of materials (i.e. different semiconductors, different thicknesses of dielectrics, etc.), a set of simulations would need to be carried out to optimize the device geometry. It is the concept of the symmetric bilayer that yields water equivalence down to low energies.

As noted above, the Monte Carlo simulation results shown in FIG. 8 demonstrate that at low photon energies (i.e. in the diagnostic energy range) the inclusion of organic materials (i.e. hydrocarbon-based materials) alone is insufficient to obtain good water equivalence. In FIG. 9, only the 20 keV simulation data were included with the 100 keV data because 20 keV represents the low end of the diagnostic imaging energy range and above 100 keV, the energy dependence is virtually eliminated. Furthermore, the response of the system does not show oscillatory behavior over this range, meaning that optimization based on response at 20 keV ensures water equivalence over the entire energy range.

Example 3: Procedure for Verifying Energy Independence Dosimeter Device

In order to measure an unknown dose using a radiation dosimeter, it must first be calibrated. The calibration process involves measuring the signal generated in response to an exposure of the radiation dosimeter to a known dose of radiation. The known dose is determined based on the calibration of the radiation emitting device with a reference dosimetry system whose calibration factor can be traced directly to a primary standards laboratory. When the exposure conditions are prescribed and the dose from the radiation emitting device is determined using reference dosimetry system, the same prescribed conditions are used to expose the uncalibrated radiation dosimeter. A calibration factor is then determined for the radiation dosimeter. If the system is water-equivalent, the calibration factor will be valid across the energy range over which the system is water-equivalent. This is because the signal generated by the radiation dosimeter will be proportional to the energy deposited in the active volume of the system. For example, various tissue-equivalent radiation dosimeters have been designed according to the present embodiments such that the ratio of the energy deposited in the active volume of the radiation dosimeter to the energy deposited in a similar volume of water will be within 5% of unity across the energy range 20-150 keV, and optionally over a broader energy range, such as from 20 keV to 10 MeV.

To test the validity of the calibration factor for tissue-equivalence, a different radiation emitting device from the one used to calibrate the radiation dosimeter should be used to provide a second radiation field with a substantially different photon energy. For example, if a medical linear accelerator with a 6 MV photon field was used to calibrate the radiation dosimeter, a diagnostic x-ray imaging or orthovoltage x-ray system should be used to test the calibration. Another reference dosimetry system with a calibration factor traceable to a primary standards lab may be used to quantify the dose (or air kerma as is common low energy applications) from this second radiation emitting device (because ionization chambers are usually used for this purpose and these devices are not energy independent over this wide an energy range—as such they require a calibration factor specific to the energy of interest in the diagnostic imaging range). When the output of the device is known, the same exposure conditions are used to expose the radiation dosimeter. With its existing calibration factor, the radiation dosimeter will produce an accurate estimate of dose if it exhibits tissue equivalence.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

Therefore what is claimed is:

1. A radiation dosimeter comprising:
  a multilayer substrate; and
  a semiconductor-based radiation sensing layer contacting said multilayer substrate;
  said radiation sensing layer comprising electrodes for receiving a signal produced in response to radiation absorbed within said radiation sensing layer; and
  said multilayer substrate comprising:
    at least one low-atomic-number layer of having an effective atomic number that is smaller than that of water; and
    at least one high-atomic-number layer having an effective atomic number that is greater than that of water;
  wherein said low-atomic-number layers and said high-atomic-number layers have respective thicknesses and compositions for modulating a dependence of the signal produced by said radiation dosimeter on photon energy, such that the signal, when calibrated to provide a measure of dose, exhibits tissue-equivalence with a variation of less than 10% over an energy range spanning 20 keV to 140 keV.

2. The radiation dosimeter according to claim 1 wherein said low-atomic-number layers and said high-atomic-number layers have respective thicknesses such that the signal produced when said radiation dosimeter is exposed to a given radiation field, and an amount of energy absorbed by a mass of water when the mass of water is exposed to the given radiation field, have respective dependencies on photon energy that are related by a scaling factor that varies by less than 10% over an energy range spanning 20 keV to 140 keV.

3. The radiation dosimeter according to claim 1 wherein said radiation dosimeter is approximately tissue equivalent over an energy range spanning 20 keV to 10 MeV.

4. The radiation dosimeter according to claim 1 wherein said radiation dosimeter is approximately tissue equivalent over an energy range spanning 10 keV to 10 MeV.

5. The radiation dosimeter according to claim 1 wherein said radiation dosimeter is approximately tissue equivalent over an energy range spanning 20 keV to 20 MeV.

6. The radiation dosimeter according to claim 1 wherein said radiation dosimeter is approximately tissue equivalent over an energy range spanning 10 keV to 20 MeV.

7. The radiation dosimeter according to claim 1 wherein at least one low-atomic-number layer is formed from a hydrocarbon-based material, and at least one high low-atomic-number layer is formed from a fluorocarbon-based material.

8. The radiation dosimeter according to claim 1 wherein said multilayer substrate is flexible.

9. The radiation dosimeter according to claim 1 wherein said radiation sensing layer comprises an organic semiconductor based device.

10. The radiation dosimeter according to claim 9 wherein said organic semiconductor based device is selected from the list consisting of organic field effect transistors and organic light emitting diodes.

11. The radiation dosimeter according to claim 1 wherein said multilayer substrate is a first multilayer substrate contacting a first side of said radiation sensing layer, said radiation dosimeter further comprising a second multilayer substrate contacting a second side of said radiation sensing layer, wherein said second multilayer substrate is configured such that the dependence on photon energy of the response of said radiation dosimeter, when radiation is detected through said second multilayer substrate, is approximately equal to the dependence on photon energy of said radiation dosimeter when radiation is detected through said first multilayer substrate.

12. The radiation dosimeter according to claim 11 wherein said first multilayer substrate and said second multilayer substrate have the same composition and layer thicknesses.

13. The radiation dosimeter according to claim 12 wherein layers within said second multilayer substrate are arranged symmetrically with regard to layers provided in said first multilayer substrate.

14. The radiation dosimeter according to claim 11 wherein said radiation sensing layer comprises a double-gate field effect transistor.

15. The radiation dosimeter according to claim 14 wherein said double-gate field effect transistor comprises:
a first gate provided adjacent to said first multilayer substrate;
a second gate provided adjacent to said second multilayer substrate;
a semiconductor channel centrally disposed between said first gate and said second gate;
a gate dielectric region respectively formed between said first gate and said semiconductor channel, and between said second gate and said semiconductor channel; and
a source and a drain respectively provided on either lateral side of said semiconductor channel.

16. The radiation dosimeter according to claim 15 wherein said first gate and said second gate are symmetrically provided relative to said semiconductor channel.

17. The radiation dosimeter according to claim 16 wherein said first multilayer substrate and said second multilayer substrate are symmetrically provided relative to said semiconductor channel.

18. The radiation dosimeter according to claim 1 wherein said low-atomic-number layers and said high-atomic-number layers have respective thicknesses and compositions for modulating a dependence of said radiation dosimeter on photon energy, such that a calibrated signal from said radiation dosimeter exhibits water-equivalence with a variation of less than 5% over an energy range spanning 20 keV to 140 keV.

19. The radiation dosimeter according to claim 1 further comprising control circuitry operatively connectable to said electrodes, wherein said control circuitry comprises at least one processor configured to receive the signal and employ a calibration factor to convert the signal into a measured dose.

20. A radiation dosimetry system comprising:
a plurality of radiation dosimeters provided according to claim 1, wherein said plurality of radiation dosimeters are spatially arranged in a two-dimensional array; and
control circuitry operatively connectable to said electrodes of said plurality of radiation dosimeters, wherein said control circuitry comprises at least one processor configured to receive the signals from said plurality of radiation dosimeters and employ one or more calibration factors to convert the signals into a two-dimensional spatial profile of measured dose.

21. A radiation dosimeter comprising:
a multilayer substrate;
a radiation sensing layer contacting said multilayer substrate; and
said radiation sensing layer comprising electrodes for receiving a signal produced in response to radiation absorbed within said radiation sensing layer; and
said multilayer substrate comprising:
at least one low-atomic-number layer of having an effective atomic number that is smaller than that of water; and
at least one high-atomic-number layer having an effective atomic number that is greater than that of water;
wherein said low-atomic-number layers and said high-atomic-number layers have respective thicknesses for modulating a dependence of said radiation dosimeter on photon energy, such that said radiation dosimeter is approximately water-equivalent over an energy range spanning 10 keV to 10 MeV.

* * * * *